(12) United States Patent  (10) Patent No.: US 6,671,075 B1
Mizunaga                   (45) Date of Patent:    Dec. 30, 2003

(54) OFFSET VOLTAGE CANCELLATION CIRCUIT

(75) Inventor: Sunao Mizunaga, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/329,788

(22) Filed: Dec. 27, 2002

(30) Foreign Application Priority Data

Jun. 24, 2002 (JP) ........................................ 2002-182527

(51) Int. Cl.[7] .............................................. H04B 10/06
(52) U.S. Cl. ............................................ 359/189; 327/74
(58) Field of Search .......................... 327/74, 72, 58, 327/62; 359/189, 194

(56) References Cited

U.S. PATENT DOCUMENTS 6,151,150 A  * 11/2000 Kikuchi .................. 359/189
6,211,716 B1 *  4/2001 Nguyen et al. .......... 327/307
6,469,547 B1 * 10/2002 Rabii ...................... 327/74
6,595,708 B1 *  7/2003 Yamashita ............... 398/202

FOREIGN PATENT DOCUMENTS

JP    08-293838    11/1996
JP    10-084231    3/1998
JP    11-041181    2/1999

* cited by examiner

Primary Examiner—Dinh T. Le
(74) Attorney, Agent, or Firm—Rabin & Berdo, P.C.

(57) ABSTRACT

Disclosed is an offset voltage cancellation circuit that can quickly cope with a change in the state and can cancel an offset voltage for differential signals. Peak voltages VP1 and VP2 of differential input signals VA1 and VA2 are retained in capacitors 12 of peak detectors $10_1$ and $10_2$. An adder $20_1$ adds the differential input signal VA1 to the peak voltage VP2 to obtain a differential output signal VC1, while an adder $20_2$ adds the differential input signal VA2 to the peak voltage VP1 to obtain a differential output signal VC2. The differential output voltages VC1 and VC2 are transmitted to a peak level reset unit 30 to generate a reset signal RST that is consonant with the potential difference, and the reset signal RST is transmitted to the gates of NMOSes 14 of the peak detectors $10_1$ and $10_2$. When an offset occurs between the differential output signals VC1 and VC2, the level of the reset signal RST is increased, and the NMOSes 14 are rendered conducive. Then, the peak voltages VP1 and VP2 stored in the capacitors 12 are reset.

15 Claims, 5 Drawing Sheets

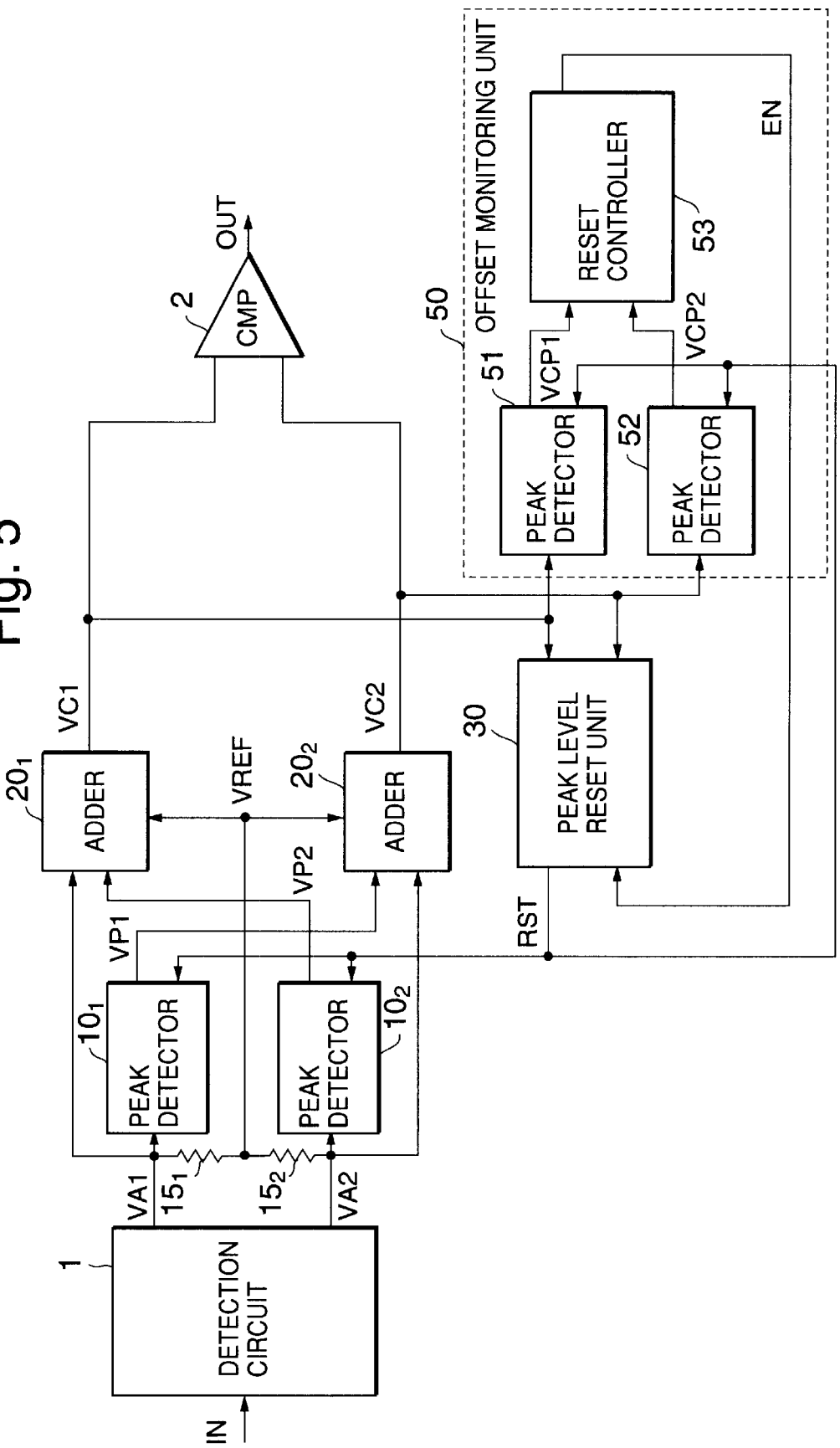

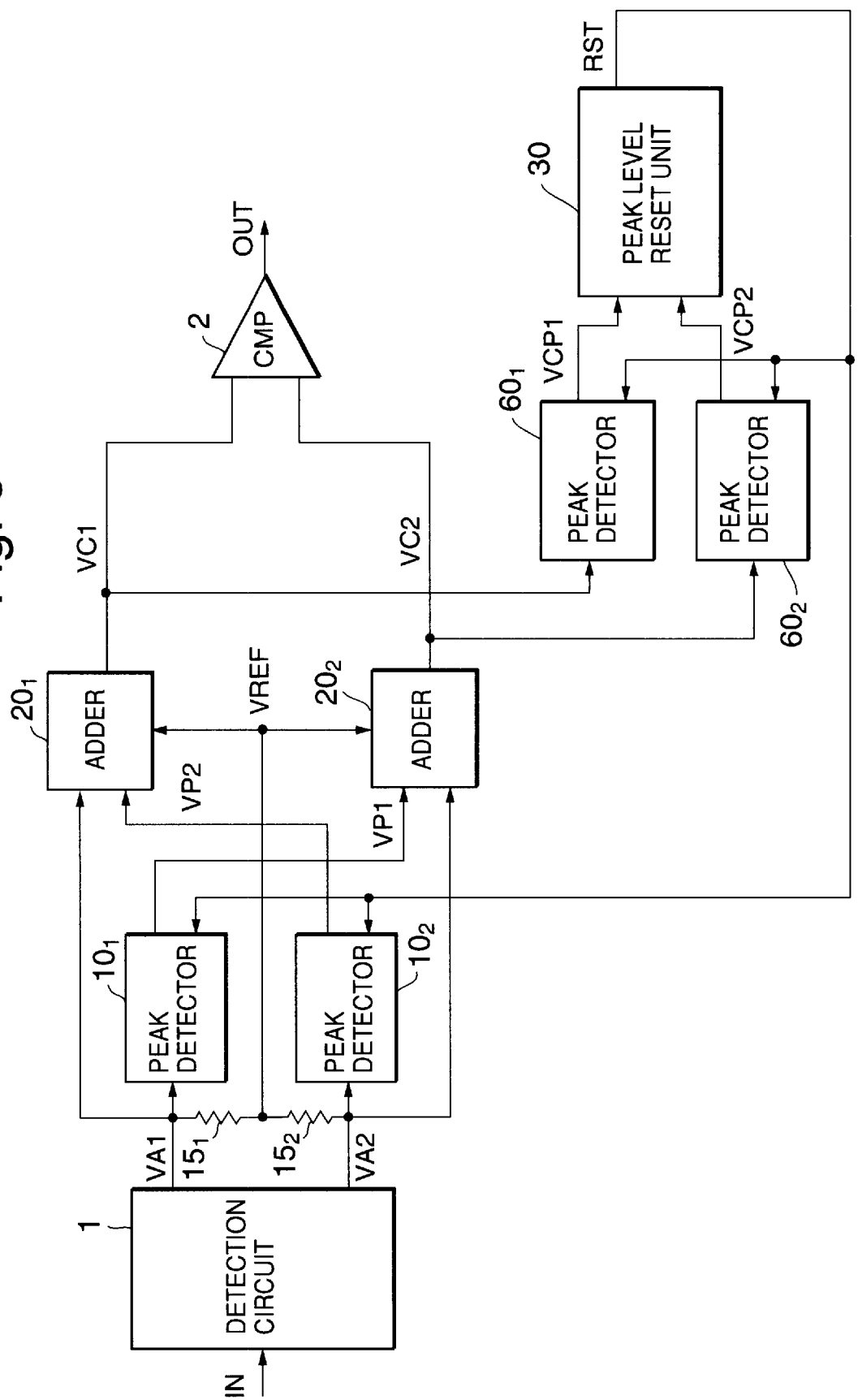

US 6,671,075 B1

OFFSET VOLTAGE CANCELLATION CIRCUIT

BACKGROUND OF THE INVENTION

1. Field of the Invention

The present invention relates to an offset voltage cancellation circuit for removing an offset voltage included in a differential signal that is output, using radio communication, by the detection circuit of a reception apparatus.

This application is counterparts of Japanese patent applications, Serial Number 182527/2002, filed June 24, the subject matter of which is incorporated herein by reference.

2. Related Arts

FIG. 2 is a diagram showing an example configuration for a conventional offset voltage cancellation circuit.

An offset cancellation circuit 90 comprises peak detectors 91 and 92 for respectively detecting, in differential input signals VA1 and VA2 received from a detection circuit 1, peak voltages VP1 and VP2; and resistors 93 and 94 for outputting, as a reference voltage VREF, an intermediate potential between the differential input signals VA1 and VA2.

The peak detectors 91 and 92, which are constituted by a voltage follower and a voltage retention capacitor, can immediately detect and cope with a rise in an input voltage and can store the maximum voltage attained. Then, when thereafter the input voltage is reduced, in congruity with a large time constant, the peak detectors 91 and 92 gradually discharge down the voltages they have stored to insure the performance of a stable operation.

The offset voltage cancellation circuit 90 also comprises: an adder 95 for adding the differential input signal VA1 to the peak voltage VP2, while using as a reference the reference voltage VREF, and outputting a differential output signal VC1; and an adder 96 for adding the differential input signal VA2 to the peak voltage VP1, while using as a reference the reference voltage VREF, and outputting a differential output signal VC2.

Assume that the differential input signals VA1 and VA2, represented by equation (1), are provided for the offset voltage cancellation circuit 90.

$$VA1=VO1+A \sin(\omega t)$$

$$VA2=VO2-A \sin(\omega t) \quad \ldots (1)$$

It should be noted that VO1 and VO2 denote the direct-current voltages elements of the differential input signals VA1 and VA2, and A denotes the amplitude for the alternating-current elements of the differential input signals VA1 and VA2.

Then, the peak voltages VP1 and VP2 output from the peak detectors 91 and 92 and the reference voltage VREF generated by the resistors 93 and 94 are represented in equation (2) as follows.

$$VP1=VO1+A$$

$$VP2=VO2+A$$

$$VREF=(VO1+VO2)/2 \quad \ldots (2)$$

The differential input signal VA1, the peak voltage VP2 and the reference voltage VREF are transmitted to the adder 95 and the differential input signal VA2, the peak voltage VP1 and the reference voltage VREF are transmitted to the adder 96, and the respective signals and data are added together at the adders 95 and 96.

As a result, the respective differential output signals VC1 and VC2 output by the adders 95 and 96 are represented by equation (3) as follows.

$$VC1=VA1+VP2-VREF=A \sin(\omega t)+A+(VO1+VO2)/2$$

$$VC2=VA2+VP1-VREF=-A \sin(\omega t)+A+(VO1+VO2)/2 \quad \ldots (3)$$

As is shown in equation (3), the differential output signals VC1 and VC2 have the same number of constant terms. This means that the direct-current voltage elements included in the differential output signals VC1 and VC2 are equal, and that the offset voltage is removed.

However, with the conventional offset voltage cancellation circuit the following problem is encountered.

The time-sharing communication for alternately changing the transmission state and the reception state is frequently employed for a radio communication system. As a time elapses, the signal received by this system is changed to a silent signal that includes only a noise element, a non-modulated carrier wave signal, a preamble signal or a modulated carrier wave signal. The direct-current voltage elements, which are included in the differential input signals VA1 and VA2 received from the detection circuit 1, differ, depending on the operating condition, and an offset voltage is generated in accordance with the direct-current voltage element.

In the offset voltage cancellation circuit in FIG. 2, the peak voltages 91 and 92 detect the peak voltages VP1 and VP2 of the differential input signals VA1 and VA2, and these peak voltages VP1 and VP2 are stored in capacitors (not shown). The voltages stored in the capacitors can immediately catch up with a rise in the peak voltages; however, when the peak voltages are reduced, the voltages stored in the capacitors are changed, in congruity with a large time constant, in order to ensure a stable operation is performed.

Therefore, when the potentials of the differential input signals VA1 and VA2 are temporarily increased due to a state change or a momentary noise, the retained peak voltages VP1 and VP2 are replaced by potentials having abnormal values, so that there are differences between them and the actual peak voltages. Thus, the peak voltages VP1 and VP2 retained by the peak detectors 91 and 92 do not match the values represented by equation (2), and the resulting offset between the differential output signals VC1 and VC2 prevents data from being received correctly.

SUMMARY OF THE INVENTION

To resolve the problem presented by the conventional technique, it is one objective of the present invention to provide an offset voltage cancellation circuit that can quickly cope with a state change, and can cancel an offset voltage between differential input signals.

To achieve this objective, according to a first aspect of the present invention, an offset voltage cancellation circuit, which removes a difference between direct-current voltage element included in first and second differential input signals, and generates a differential signal including first and second output signals, comprises: first and second peak detectors; first and second adders; and a peak level reset unit, all of which are described below.

The first peak detector includes a first capacitor for storing the peak level of the first input signal. The first peak detector outputs voltage corresponding to a charge stored in the first capacitor as a first peak voltage. The first peak detector also discharges a charge stored in the first capacitor in response to a reset signal. The second peak detector includes a second capacitor for storing the peak level of the second input signal. The second peak detector outputs a voltage corresponding to a charge stored in the second capacitor as a second peak voltage, and discharges a charge stored in the second capacitor in response to the reset signal.

The first adder adds the first input signal to the second peak voltage to generate the first output signal, and the second adder adds the second input signal to the first peak voltage to generate the second output signal. The peak level reset unit outputs the reset signal corresponding to a potential difference between the first and second output signals.

According to a second aspect, an offset voltage cancellation circuit comprises: the first and second peak detectors and the first and the second adders, which are the same as those in the first aspect; a reset controller which monitors the peak voltages of the first and second output signals and which outputs a reset enable signal when a difference between said peak voltages exceeds a predetermined level a reset controller; and a peak level reset unit which outputs the reset signal corresponding to a potential difference between the first and the second output signals when the reset enable signal is received thereto.

According to a third aspect of the present invention, an offset voltage cancellation circuit comprises: the first and second peak detectors and the first and second adders, which are the same as those for the first aspect; and a peak level reset unit which outputs the reset signal corresponding to a potential difference between the first and the second output signals when a difference between the peak voltages of the first and the second output signals exceeds a predetermined level.

According to the present invention, the following operations are performed by the thus arranged offset voltage cancellation circuit.

The peak voltages of the first and the second input signals are respectively detected by the first and the second peak detectors, and are stored in the first and the second capacitors. Further, the first input signal is added to the second peak voltage by the first adder, and the first output signal is generated. The second input signal is then added to the first peak voltage by the second adder, and the second output signal is generated. So long as the levels of the input signals are stabilized, through the addition performed by the first and second adders, the value of the direct-current voltage element included in the first output signal corresponds to the value of the second output signal and the offset voltage is canceled.

When the level of the input signal is changed and the peak voltage held by the first or second peak detector is raised, the level of the first or the second output signal is changed, and the potential difference between these output signals is increased. Therefore, the level of the reset signal output by the peak level resetting signal is increased, the capacitors of the first and second peak detectors are discharged, and the first and second peak voltages are reset. Then, the first and second peak voltages are maintained in accordance with the first and second signals that are newly input.

BRIEF DESCRIPTION OF THE DRAWINGS

FIG. 5 is a diagram showing the configuration of an offset voltage cancellation circuit according to a second embodiment of the present invention; and FIG. 6 is a diagram showing the configuration of an offset voltage cancellation circuit according to a third embodiment of the present invention.

DETAILED DESCRIPTION OF THE PREFERRED EMBODIMENTS

First Preferred Embodiment

Figure 1:
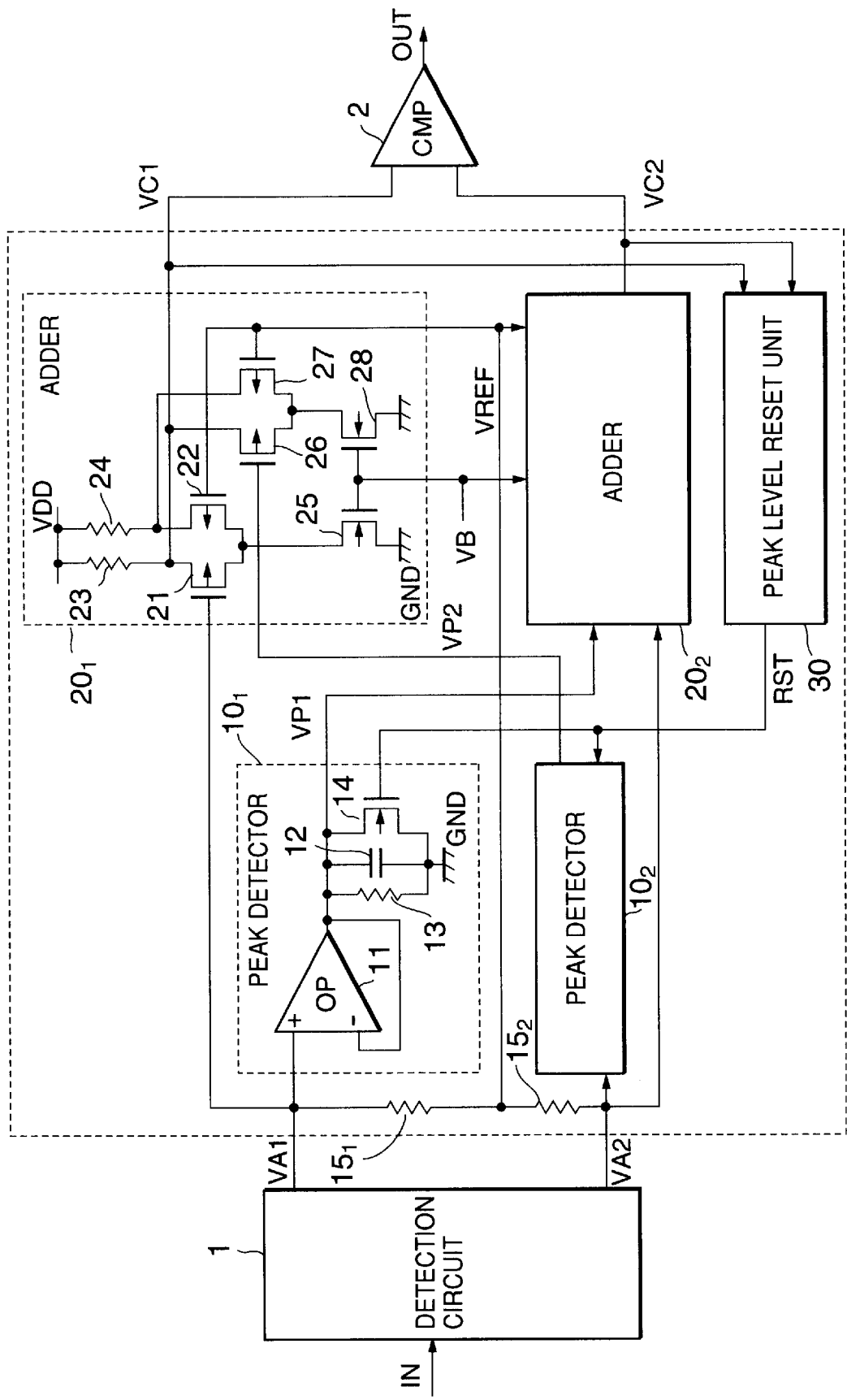
FIG. 1 is a diagram showing the configuration of an offset voltage cancellation circuit according to a first embodiment of the present invention.
Figure 2:
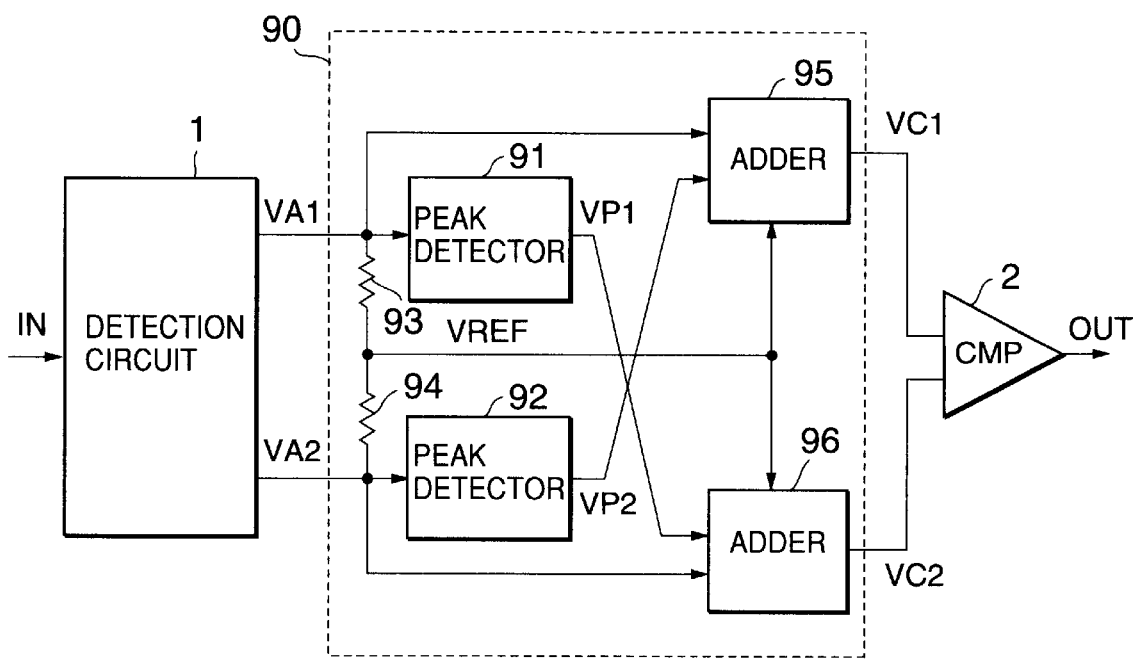
FIG. 2 is a diagram showing an example configuration for a conventional offset cancellation circuit.

FIG. 1 is a diagram showing the configuration of an offset voltage cancellation circuit according to a first embodiment of the present invention.

The offset voltage cancellation circuit receives differential input signals VA1 and VA2 (also called complementary input signals) from a detection circuit 1 for detecting an input signal, removes a difference (i.e., an offset voltage) between the direct-current voltage elements included in the signals VA1 and VA2, generates differential output signals (also called complementary output signals) that have no offset, and transmits the signals VC1 and VC2 to a comparator 2. The comparator 2, for which a hysteresis characteristic is provided, generates output data OUT based on the differential output signals VC1 and VC2.

The offset voltage cancellation circuit also includes peak detectors $10_1$ and $10_2$, which have a reset function, for detecting and holding the maximum potential values of the differential input signals VA1 and VA2, received from the detection circuit 1, and for outputting the maximum potential values as peak voltages VP1 and VP2.

The same configuration is employed for the peak detectors $10_1$ and $10_2$, while provided for the peak detector $10_1$, for example, is an operational amplifier (OP) 11 that constitutes a voltage follower, and the differential input signal VA1 is provided for the input side of the operating amplifier 11. A peak voltage holding capacitor 12, a resistor 13, for coping with the change in the peak voltage in congruity with a large time constant, and an N channel MOS transistor (hereinafter referred to as an "NMOS") 14, which forcibly discharges down the capacitor 12 in response to the reception of a reset signal RST, are connected in parallel between the output side of the operating amplifier 11 and the ground terminal GND.

Further, the differential input signals VA1 and VA2 are respectively transmitted to the ends of the resistors $15_1$ and $15_2$, which have the same resistance and are connected in series, and the potential at the contact point between the resistors $15_1$ and $15_2$ is output as the reference voltage VREF.

The offset voltage cancellation circuit includes an adder $20_1$ for adding the differential input signal VA1 to the peak voltage VP2, while using the reference voltage VREF as a reference, and outputting a differential output signal VC1; and an adder $20_2$ for adding the differential input signal VA2 to the peak voltage VP1 and outputting a differential output signal VC2.

The adders $20_1$ and $20_2$ have the same configuration, while the adder $20_1$, for example, includes a P channel MOS transistor (hereafter referred to as a "PMOS") for receiving at its gate the differential input signal VA1 and a PMOS 22 for receiving at its gate the reference voltage VREF. The sources of the PMOSes 21 and 22 are connected to a power source VDD by resistors 23 and 24, and the drains of the PMOSes 21 and 22 are connected to the ground terminal GND through an NMOS 25 that constitutes a constant current circuit.

The adder $20_1$ includes a PMOS 26 for receiving at its gate the peak voltage VP2 and a PMOS 27 for receiving at its gate the reference voltage VREF. The sources of the PMOSes 26 and 27 are respectively connected to the sources of the PMOSes 21 and 22, and the drains of the PMOSes 26 and 27 are connected to the ground terminal GND through an NMOS 28 that constitutes a constant current circuit. A predetermined bias voltage VB is applied to the gates of the NMOSes 25 and 28.

In the thus arranged adder $20_1$, a current consonant, respectively, with the differential input voltage VA1 and the peak voltage VP2 flows across the PMOSes 21 and 26, and a current consonant with the reference voltage VREF flows across the PMOSes 22 and 27. The PMOSes 21 and 22 and the PMOSes 26 and 27 respectively constitute differential circuits, while the current flowing through the PMOSes 21 and 26 traverses the resistor 23, and the current flowing through the PMOSes 22 and 27 traverses the resistor 24.

The adder $20_1$, while using the reference voltage VREF as a reference, adds the differential input signal VA1 to the peak voltage VP2 and outputs the resultant voltage as the differential output signal VC1 to the source of the PMOS 21. Similarly, while using the reference voltage VREF as a reference, the adder $20_2$ adds the differential input signal VA2 to the peak voltage VP1 and outputs the resultant voltage as the differential output signal VC2. These differential output signals VC1 and VC2 are transmitted to the comparator 2.

The offset voltage cancellation circuit further includes a peak level reset unit 30. The peak level reset unit 30 detects the absolute value of the potential difference between the differential output signals VC1 and VC2, and outputs the reset signal RST to the peak detectors $10_1$ and $10_2$ when the potential difference is increased.

Figure 3:
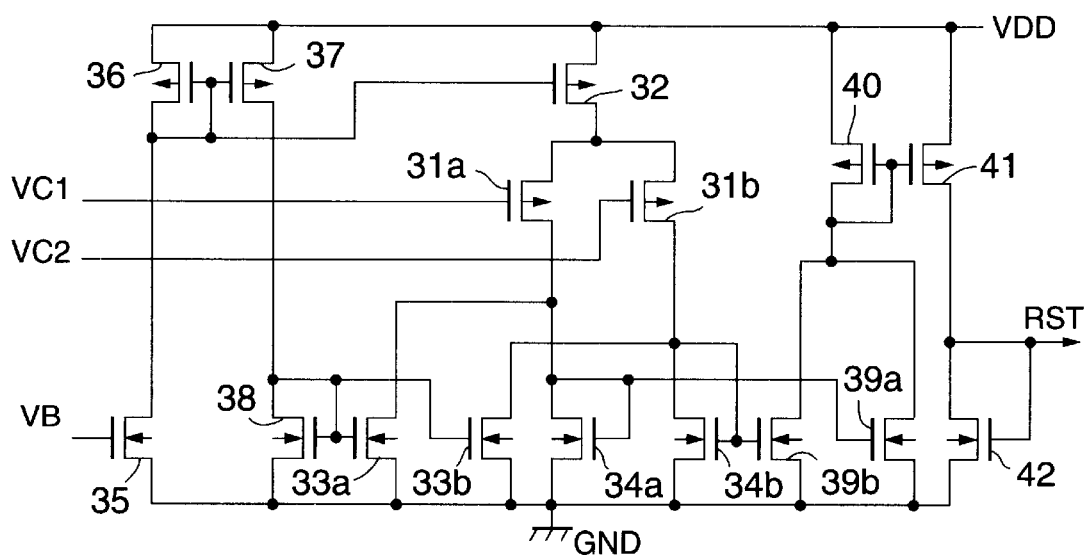
FIG. 3 is a circuit diagram showing a peak level reset unit 30 in FIG. 1.

FIG. 3 is a circuit diagram showing an example for the peak level reset unit 30 in FIG. 1.

The peak level reset unit 30 includes PMOSes 31a and 31b for receiving at their respective gates the differential output signals VC1 and VC2, and the sources of the PMOSes 31a and 31b are connected to the power source VDD through the PMOS 32. The drain of the PMOS 31a is connected to the ground terminal GND through an NMOS 33a, and also through an NMOS 34a. Further, the drain of the PMOS 31b is connected to the ground terminal GND through an NMOS 33b, and also through an NMOS 34b.

The peak level reset unit 30 includes an NMOS 35 that, upon application of the predetermined bias voltage VB, serves as a constant current circuit. The source of the NMOS 35 is connected to the ground terminal GND, and the drain is connected to the power source VDD through a PMOS 36. A PMOS 37 that constitutes a current mirror circuit is connected to the PMOS 36, and the gates of the PMOSes 36, 37 and 32 are connected to the drain of the NMOS 35.

The drain of the PMOS 37 is connected to the ground terminal GND through an NMOS 38 and is also connected to the gates of the NMOSes 33a and 33b, and the NMOSes 38, 33a and 33b constitute a current mirror circuit.

The drains of the PMOSes 31a and 31b are connected to the gates of NMOSes 39a and 39b, while the sources of the NMOSes 39a and 39b are connected to the ground terminal GND and the drains thereof are connected to the power source VDD through a PMOS 40. A PMOS 41 that constitutes a current mirror circuit is connected to the PMOS 40, and the gates of the PMOSes 40 and 41 are connected to the drain of the PMOS 40. The drain of the PMOS 41 is connected to the drain and the gate of the NMOS 42, and the source of the NMOS 42 is connected to the ground terminal GND. The reset signal RST is output by the gate of the NMOS 42.

FIGS. 4(a) to 4(d) are signal waveform diagrams showing an example operation performed by the offset voltage cancellation circuit shown in FIG. 1. The operation of the offset voltage cancellation circuit in FIG. 1 will now be described while referring to FIGS. 4(a) to 4(d).

Figure 4A:
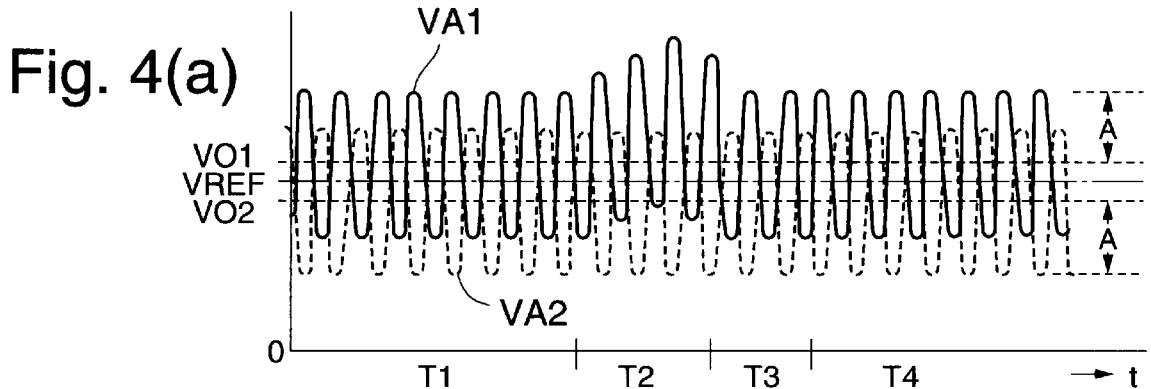
FIG. 4 is a signal waveform diagram showing an example operation performed by the offset voltage cancellation circuit in FIG. 1.
Figure 4B:
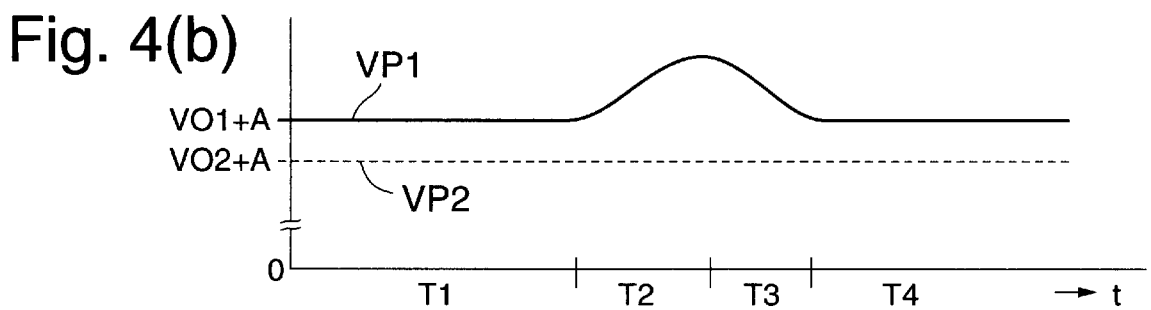

During a period T1 in FIGS. 4(a) to 4(d), when the differential input signals VA1 and VA2 received from the detection circuit 1 are stable, and when the direct-current voltage elements of the differential input signals VA1 and VA2 are defined as VO1 and VO2 and the amplitude of an alternating-current voltage element is defined as A, a signal waveform represented by equation (1) is obtained, as is shown in FIG. 4(a). Further, the intermediate potential between the differential input signals VA1 and VA2 is output as the reference potential VREF at the contact point between the resistors $15_1$ and $15_2$. At this time, as is shown in FIG. 4(b), the peak voltages VP1 and VP2 output from the peak detectors $10_1$ and $10_2$ are constant voltages represented by equation (2).

The differential input signal VA1, the peak voltage VP2 and the reference voltage VREF are received by the adder $20_1$ and are added together, while the differential input signal VA2, the peak voltage VP1 and the reference voltage VREF are received by the adder $20_2$ and are added together. Therefore, as is represented by equation (3), the differential output signals VC1 and VC2, which have the same direct-current elements and from which the offset voltage has been removed, are respectively output by the adders $20_1$ and $20_2$.

Figure 4C:
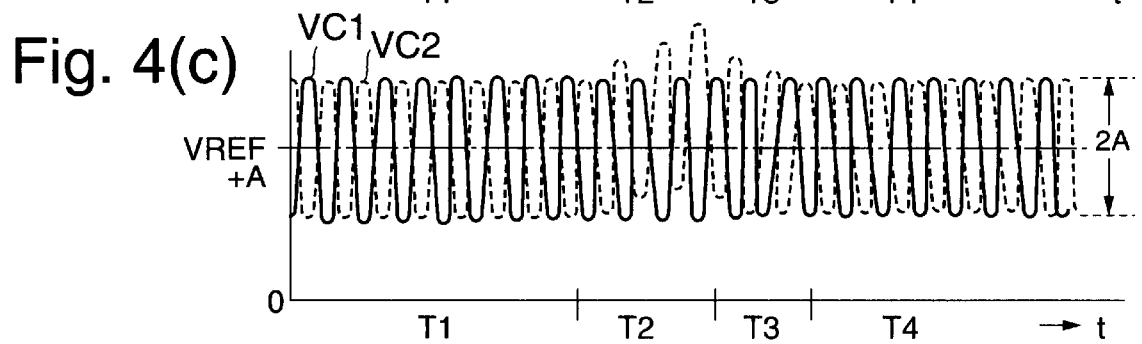
Figure 4D:
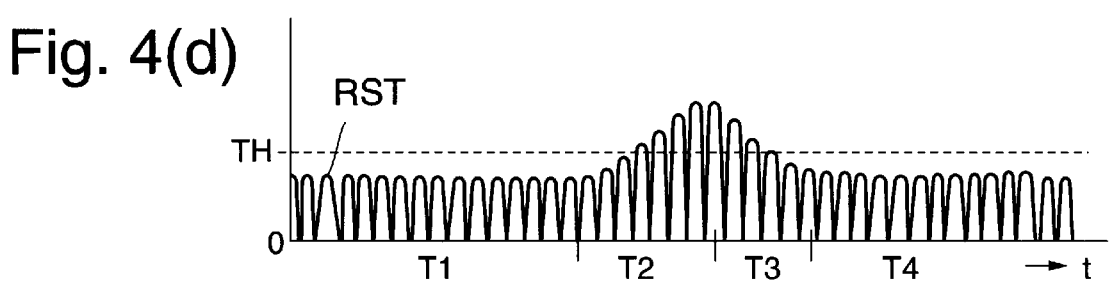

The differential output signals VC1 and VC2 are transmitted to the peak level reset unit 30, and a signal that is consonant with the absolute value of the potential difference between the differential output signals VC1 and VC2 is output as the reset signal RST. Since during the period T1 an offset voltage does not occur between the differential output signals VC1 and VC2, the maximum potential difference between the differential output signals VC1 and VC2 is 2A, as is shown in FIG. 4(c). Therefore, the amplitude of the reset signal RST has a value proportional to the amplitude 2A.

The reset signal RST is transmitted to the gates of the NMOSes 14 of the peak detectors $10_1$ and $10_2$, and when in the stable state the maximum value (2A) of the reset signal RST is set equal to or smaller than a threshold value TH of the NMOSes 14, the NMOSes 14 are maintained in the OFF state. At the same time, the differential output signals VC1 and VC2, from which the offset voltage has been removed, are transmitted to the comparator 2, and binary output data OUT is generated.

Next, assume that during a period T2 the direct-current voltage element of the differential input signal VA1 received from the direction circuit 1 is raised for a specific reason. Accordingly, the potential of the differential input signal VA1 is changed, while the peak voltage VP1 output by the peak detector $10_1$ is increased. As the peak voltage VP1 rises, the levels of the differential output signals VC1 and VC2 output by the adders $20_1$ and $20_2$ are also changed, and the value of the maximum potential difference between the differential output signals VC1 and VC2 is increased.

Accordingly, the amplitude of the reset signal RST output by the peak level reset unit 30 is increased, and when the amplitude of the reset signal RST exceeds the threshold value TH of the NMOSes 14, a current begins to flow to the NMOSes 14. Then, through the NMOSes 14, the capacitors 12 of the peak detectors $10_1$ and $10_2$ are discharged down and the peak voltages VP1 and VP2 are reduced.

During a period T3, when the differential input signal VA1 has recovered from the change and when the peak voltages VP1 and VP2 stored in the capacitors 12 match the peak voltages VP1 and VP2 of the actual differential input signals VA1 and VA2, the offset voltage has removed from the differential output signals VC1 and VC2 output by the adders $20_1$ and $20_2$. Thus, the amplitude of the reset signal RST output by the peak level reset unit 30 is also returned to a value equal to or smaller than the threshold value Th of the NMOSes 14, the NMOSes 14 are rendered off, and the original stable state is recovered.

The operation wherein the differential input voltage VA1 is temporarily changed and the original state is thereafter recovered has been explained. However, the process for the resetting and the re-designation of the peak voltages VP1 and VP2 is performed in the same manner as when the levels of the differential input signals VP1 and VA2 are changed step-by-step, or as when pulse shaped noise is superimposed.

As is described above, the offset voltage cancellation circuit of the first embodiment comprises: the peak detectors $10_1$ and $10_2$, which have as one function, performed in accordance with the reset signal RST, the resetting (discharging down) of the peak voltages VP1 and VP2 that are stored; and the peak level reset unit 30, which outputs a reset signal RST that is consonant with the potential difference between the differential output voltages VC1 and VC2 that are output by the adders $20_1$ and $20_2$. With this configuration, a state change of the differential input signal can be quickly coped with, and the offset voltage can be canceled.

Second Preferred Embodiment

FIG. 5 is a diagram showing the configuration of an offset voltage cancellation circuit according to a second embodiment of the present invention. The same reference numerals as are used in FIG. 1 are employed in FIG. 5 to denote corresponding components.

The offset voltage cancellation circuit in this embodiment is so designed that an offset monitoring unit 50 is added to the offset voltage cancellation circuit in FIG. 1. The offset monitoring unit 50 monitors the peak voltages of the differential output signals VC1 and VC2 that are output by the adders $20_1$ and $20_2$, and halts the operation of the peak level reset unit 30 when a difference in the peak voltages is equal to or smaller than a predetermined value.

The offset monitoring unit 50 comprises: peak detectors 51 and 52 for detecting peak voltages VCP1 and VCP2 of the differential output signals VC1 and VC2, which are output from the adders $20_1$ and $20_2$; and a reset controller 53 for generating an enable signal EN for the peak level reset unit 30 when the potential difference between the peak voltages VCP1 and VCP2 exceeds a predetermined value.

The peak detectors 51 and 52 have the same circuit configuration as the peak detector $10_1$ in FIG. 1, for example, and the rest signal RST is transmitted by the peak level reset unit 30 to the NMOSes 14 of the peak detectors 51 and 52. The reset controller 53 has the same circuit configuration as the peak level resetting unit in FIG. 3, for example, but it replaces the reset signal RST with the enable signal EN, which is transmitted to the peak level reset unit 30 instead of the bias signal BS.

In this offset voltage cancellation circuit, the peak detectors 51 and 52 detect the peak voltages VCP1 and VCP2 of the differential output voltages VC1 and VC2 that are output by the adders $20_1$ and $20_2$. When the potential difference between the peak voltages VCP1 and VCP2 exceeds a predetermined value, the reset controller 53 outputs the enable signal EN to the peak level reset unit 30. The peak level reset unit 30 is then enabled, and performs the same operation as in the first embodiment.

When the potential difference between the peak voltages VCP1 and VCP2 is equal to or smaller than a predetermined value, the reset controller 53 does not output the enable signal EN to the peak level reset unit 30, and inhibits the operation of the peak level reset unit 30. Therefore, the erroneous operation of the peak level reset unit 30 due to a small noise can be suppressed.

As is described above, in the second embodiment, only when the potential difference between the peak voltages VCP1 and VCP2 of the differential output voltages VC1 and VC2 exceeds a predetermined value is the offset monitoring unit 50, which enables the operation of the peak level reset unit 30, provided for the offset voltage cancellation circuit. Therefore, in addition to the advantages of the first embodiment, the erroneous operation of the peak level reset unit 30 due to a small noise is suppressed, and a stable offset voltage cancellation operation can be performed.

Third Preferred Embodiment

FIG. 6 is a diagram showing the configuration of an offset voltage cancellation circuit according to a third embodiment of the present invention. The same reference numerals as are used in FIG. 1 are employed in FIG. 6 to denote corresponding components.

In the offset voltage cancellation circuit, peak detectors $60_1$ and $60_2$ are provided on the input side of the peak level reset unit 30 in FIG. 1. With this configuration, for the differential output voltages VC1 and VC2 output by the adders $20_1$ and $20_2$, the peak voltages VCP1 and VCP2 are detected by the peak detectors $60_1$ and $60_2$ and are transmitted to the peak level reset unit 30.

The peak detectors $60_1$ and $60_2$ have the same circuit arrangement as the peak detector $10_1$ shown in FIG. 1, for example, and the reset signal RST is transmitted from the peak level reset unit 30 to the NMOSes 14 of the peak detectors $60_1$ and $60_2$. The remainder of the configuration is the same as is shown in FIG. 1.

In the offset voltage cancellation circuit, the peak detectors $60_1$ and $60_2$ detect the peak voltages VCP1 and VCP2 of the differential output voltages VC1 and VC2 obtained by the adders $20_1$ and $20_2$. When the potential difference between the peak voltages VCP1 and VCP2 exceeds a predetermined value, the peak level reset unit 30 outputs the reset signal RST. Then, the same operation is performed as in the first embodiment.

When the potential difference between the peak voltages VCP1 and VCP2 is equal to or smaller than the predetermined value, the reset signal RST is not output by the peak level reset unit 30.

As is described above, while in the first embodiment the peak level reset unit 30 outputs the reset signal RST based on the potential difference between the differential output signals VC1 and VC2 output by the adders $20_1$ and $20_2$, in the third embodiment the peak level reset unit 30 outputs the reset signal RST when the potential difference between the peak voltages VCP1 and VCP2 of the differential output voltages VC1 and VC2 exceeds a predetermined value. Therefore, with a configuration;that is simpler than the one in the second embodiment, not only, as in the second embodiment, can an erroneous operation of the peak level reset unit 30 due to a small noise be suppressed, but a stabler offset voltage cancellation operation can be performed.

It should be noted that the present invention is not limited to these embodiments, and can be variously modified. Example modifications of the invention are as follows.

(a) The circuit configurations of the peak detector 10, the adder 10 and the peak level reset unit 30 are not limited to those shown in the drawings. So long as the same functions are available, other circuit configurations can be employed.

(b) While in the above embodiments the peak detector 10 detects the maximum voltage value, the peak detector may instead detect the minimum value.

(c) Instead of the peak detector 10, a circuit may be employed that detects the direct-current voltage element included in the differential input signal VA1 or VA2.

(d) In the above embodiments, the conductive state of the NMOS 14 of the peak detector 10 is controlled in an analog manner in accordance with the level of the reset signal RST received from the peak level reset unit 30. However, a binary reset signal may be generated by a comparator, and the conductive state of the NMOS may be controlled in a digital manner.

As is described above, according to the first aspect of the present invention, an offset voltage cancellation circuit comprises: the first and the second peak detectors, both of which have a function for resetting the retained peak voltages in accordance with the output of a reset signal; and the peak level reset unit, which outputs the reset signal in accordance with the potential difference between the first and the second signals output by the first and the second adders. Thus, a change in the state of the differential input signal can be quickly coped with, and an offset voltage can be canceled.

According to the second aspect of the invention, a reset controller is provided that enables the operation of the peak resetting unit only when the difference between the peak voltages of the first and second output signals exceeds a predetermined value. Therefore, in addition to the effects obtained by the first aspect, the erroneous operation of the peak level reset unit due to a small noise can be suppressed, and a stabler offset voltage cancellation process can be performed.

According to the third aspect of the invention, a peak level reset unit is provided that, when the difference between the peak voltages of the first and second output signals exceeds a predetermined value, outputs as a reset signal a signal that corresponds to the absolute value of the potential difference between the first and the second output signal. Thus, the same effects can be obtained with a configuration that is simpler than the one in the second aspect.

What is claimed is:

1. An offset voltage cancellation circuit, which removes a difference between direct-current voltage element included in first and second differential input signals, and generates a differential signal including first and second output signals, comprising:

a first peak detector which includes a first capacitor for storing the peak level of said first input signal, which outputs a voltage corresponding to a charge stored in said first capacitor as a first peak voltage, and which discharges said charge stored in said first capacitor in response to a reset signal;

a second peak detector which includes a second capacitor for storing the peak level of said second input signal, which outputs a voltage corresponding to a charge stored in said second capacitor as a second peak voltage, and which discharges said charge stored in said second capacitor in response to said reset signal;

a first adder which adds said first input signal to said second peak voltage to generate said first output signal;

a second adder which adds said second input signal to said first peak voltage to generate said second output signal; and a peak level reset unit which outputs said reset signal, the reset signal corresponding to a potential difference between said first and second output signals.

2. An offset voltage cancellation circuit as set forth claim 1, wherein said first peak detector has an input terminal receiving the first input signal and an output terminal outputting the first peak voltage, wherein said first capacitor has a first terminal coupled to the output terminal and a second terminal coupled to a first terminal supplied with a reference voltage.

3. An offset voltage cancellation circuit as set forth claim 2, further comprising a switching circuit which is coupled between the output terminal and the first terminal and which electrically connects the output terminal and the first terminal in response to the reset signal.

4. An offset voltage cancellation circuit as set forth claim 3, wherein said switching circuit comprises a transistor having a first electrode coupled to the output terminal, a second electrode coupled to the first terminal, and a control electrode receiving the reset signal.

5. An offset voltage cancellation circuit as set forth claim 4, wherein the first reference voltage is a ground voltage.

6. An offset voltage cancellation circuit, which removes a difference between direct-current voltage element included in first and second differential input signals, and generates a differential signal including first and second output signals, comprising:

a first peak detector which includes a first capacitor for storing the peak level of said first input signal, which outputs a voltage corresponding to a charge stored in said first capacitor as a first peak voltage, and which discharges said charge stored in said first capacitor in response to a reset signal;

a second peak detector which includes a second capacitor for storing the peak level of said second input signal, which outputs a voltage corresponding to a charge stored in said second capacitor as a second peak voltage, and which discharges said charge stored in said second capacitor in response to said reset signal;

a first adder which adds said first input signal to said second peak voltage to generate said first output signal;

a second adder which adds said second input signal to said first peak voltage to generate said second output signal; and a reset controller which monitors the peak voltages of said first and second output signals and which outputs a reset enable signal when a difference between said peak voltages exceeds a predetermined level; and a peak level reset unit which outputs said reset signal corresponding to a potential difference between said first and said second output signals when said reset enable signal is received thereto.

7. An offset voltage cancellation circuit as set forth claim 6, wherein said first peak detector has an input terminal receiving the first input signal and an output terminal outputting the first peak voltage, wherein said first capacitor has a first terminal coupled to the output terminal and a second terminal coupled to a first terminal supplied with a reference voltage.

8. An offset voltage cancellation circuit as set forth claim 7, further comprising a switching circuit which is coupled between the output terminal and the first terminal and which electrically connects the output terminal and the first terminal in response to the reset signal.

9. An offset voltage cancellation circuit as set forth claim 8, wherein said switching circuit comprises a transistor having a first electrode coupled to the output terminal, a second electrode coupled to the first terminal, and a control electrode receiving the reset signal.

10. An offset voltage cancellation circuit as set forth claim 9, wherein the first reference voltage is a ground voltage.

11. An offset voltage cancellation circuit, which removes a difference between direct-current voltage element included in first and second differential input signals, and generates a differential signal including first and second output signals, comprising:
  a first peak detector which includes a first capacitor for storing the peak level of said first input signal, which outputs a voltage corresponding to a charge stored in said first capacitor as a first peak voltage, and which discharges said charge stored in said first capacitor in response to a reset signal;
  a second peak detector which includes a second capacitor for storing the peak level of said second input signal, which outputs a voltage corresponding to a charge stored in said second capacitor as a second peak voltage, and which discharges said charge stored in said second capacitor in response to said reset signal;
  a first adder which adds said first input signal to said second peak voltage to generate said first output signal;
  a second adder which adds said second input signal to said first peak voltage to generate said second output signal; and
  a peak level reset unit which outputs said reset signal corresponding to a potential difference between said first and said second output signals when a difference between said peak voltages of said first and said second output signals exceeds a predetermined level.

12. An offset voltage cancellation circuit as set forth claim 11, wherein said first peak detector has an input terminal receiving the first input signal and an output terminal outputting the first peak voltage, wherein said first capacitor has a first terminal coupled to the output terminal and a second terminal coupled to a first terminal supplied with a reference voltage.

13. An offset voltage cancellation circuit as set forth claim 12, further comprising a switching circuit which is coupled between the output terminal and the first terminal and which electrically connects the output terminal and the first terminal in response to the reset signal.

14. An offset voltage cancellation circuit as set forth claim 13, wherein said switching circuit comprises a transistor having a first electrode coupled to the output terminal, a second electrode coupled to the first terminal, and a control electrode receiving the reset signal.

15. An offset voltage cancellation circuit as set forth claim 14, wherein the first reference voltage is a ground voltage.

* * * * *